(12) United States Patent
Mishiro et al.

(10) Patent No.: US 7,835,159 B2
(45) Date of Patent: Nov. 16, 2010

(54) METHOD OF MAKING ASSEMBLY MODULE AND BOARD MODULE AND ELECTRONIC APPARATUS

(75) Inventors: Kinuko Mishiro, Kawasaki (JP); Yutaka Higashiguchi, Kawasaki (JP); Masahiko Yamashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 333 days.

(21) Appl. No.: 11/892,930

(22) Filed: Aug. 28, 2007

(65) Prior Publication Data
US 2008/0101048 A1 May 1, 2008

(30) Foreign Application Priority Data
Oct. 30, 2006 (JP) ............................. 2006-294949

(51) Int. Cl.
*H05K 1/11* (2006.01)
*H05K 1/14* (2006.01)

(52) U.S. Cl. .................. 361/784; 361/759; 361/755

(58) Field of Classification Search ............ 361/784, 361/759, 752, 790, 797, 800, 755
See application file for complete search history.

(56) References Cited

U.S. PATENT DOCUMENTS

| | | | | |
|---|---|---|---|---|
| 4,721,365 A | * | 1/1988 | Nishimura | 349/152 |
| 5,670,994 A | * | 9/1997 | Kawaguchi et al. | 345/206 |
| 5,982,468 A | * | 11/1999 | Satou et al. | 349/150 |
| 6,614,499 B1 | * | 9/2003 | Petruchik | 349/149 |
| 6,937,004 B2 | | 8/2005 | Ohazama | |
| 7,236,624 B2 | | 6/2007 | Ohazama | |
| 2003/0053056 A1 | | 3/2003 | Ohazama | |
| 2003/0155908 A1 | | 8/2003 | Ohazama | |
| 2005/0201670 A1 | | 9/2005 | Uchiyama | |

FOREIGN PATENT DOCUMENTS

| | | |
|---|---|---|
| CN | 1409283 A | 4/2003 |
| JP | 2000-310789 | 11/2000 |
| JP | 2002-289306 | 10/2002 |
| JP | 2003-110235 | 4/2003 |
| JP | 2003-243460 | 8/2003 |
| JP | 2006-235503 | 9/2006 |

OTHER PUBLICATIONS

Chinese Office Action dated Jul. 24, 2009 for related Chinese Application No. 200710149282.1.
Office Action mailed on Apr. 29, 2008 and issued in corresponding Korean Patent Application No. 10-2007-0088835.

* cited by examiner

*Primary Examiner*—Hung S Bui
(74) *Attorney, Agent, or Firm*—Staas & Halsey LLP

(57) ABSTRACT

A second member is superposed on a first member. A first recognition mark is described on the surface of the first member. A second recognition mark is described on the surface of the second members. The first recognition mark is fragmented along the edge of the second member when the second member is superposed on the first member. The second recognition mark ends at the edge of the second member. The second recognition mark cooperates with the first recognition mark for establishment of a predetermined geometric pattern. The relative positions of the first and second recognition marks can be adjusted based on an irregular or unshaped geometric pattern. The second member can thus reliably be superposed on the surface of the first member at the correct position.

22 Claims, 9 Drawing Sheets

METHOD OF MAKING ASSEMBLY MODULE AND BOARD MODULE AND ELECTRONIC APPARATUS

BACKGROUND OF THE INVENTION

1. Field of the Invention

The present invention relates to a method of making an assembly module including a second member superposed on a first member.

2. Description of the Prior Art

A glass substrate is widely utilized in the field of a display apparatus such as a liquid crystal display. A flexible printed wiring board is bonded to the glass substrate, for example. An anisotropic electrically-conductive adhesive is utilized for the bonding, for example. A control signal is supplied to the glass substrate through the flexible printed wiring board.

First electrodes are formed on the surface of the glass substrate. Second electrodes are correspondingly formed on the surface of the flexible printed wiring board. When the second electrodes are to be bonded to the first electrodes, the individual second electrode needs to be correctly coupled to the corresponding first electrode. A recognition mark is formed on each of the glass substrate and the flexible printed wiring board for aligning the second electrodes to the corresponding first electrodes. The transparency of the glass substrate is useful for the alignment of the recognition marks.

In the case where an opaque rigid printed wiring board is utilized in place of the glass substrate, the recognition marks are hidden behind the rigid printed wiring board. The flexible printed wiring board cannot thus be aligned to the rigid printed wiring board. This results in a positional shift between the first electrodes and the corresponding second electrodes.

SUMMARY OF THE INVENTION

It is accordingly an object of the present invention to provide a method of making an assembly module, enabling a reliable superposition of a second member on a first member regardless of the transparency of each of the first and second member. It is also an object of the present invention to provide a method of making an assembly module, enabling a reliable superposition of a second printed wiring board on a first printed wiring board regardless of the transparency of each of the first and second printed wiring boards.

According to a first aspect of the present invention, there is provided a method of making an assembly module, comprising: superposing a second member on a first member; and coupling a second recognition mark to a first recognition mark so as to allow the second recognition mark to cooperate with the first recognition mark for establishment of a predetermined geometric pattern, the second recognition mark described on the surface of the second member and ending at the edge of the second member, the first recognition mark described on the surface of the first member and fragmented along the edge of the second member.

A part of the first recognition mark is exposed at a position outside the second member. The second recognition mark is coupled to the exposed part of the first recognition mark. The relative position of the first and second recognition marks can be adjusted based on an irregular or unshaped geometric pattern. The second member can thus reliably be superposed on the surface of the first member at the correct position.

The method serves to provide an assembly module comprising: a first member; a second member superposed on the first member; a first recognition mark described on a surface of the first member, the first recognition mark fragmented along an edge of the second member; and a second recognition mark described on the surface of the second member, the second recognition mark ending at the edge of the second member, the second recognition mark cooperating with the first recognition mark for establishment of a predetermined geometric pattern when the second member is superposed on the surface of the first member at a correct position. Here, the first member may be a rigid printed wiring board. The rigid printed wiring board may be opaque. The second member may be a flexible printed wiring board. The flexible printed wiring board may have a transparency insufficient to visualize the first recognition mark when the flexible printed wiring board is superposed on the rigid printed wiring board to at least partly cover the first recognition mark.

The rigid printed wiring board may include a wiring pattern layer defining the first recognition mark and electrodes. A single mask pattern can be utilized to form the first recognition mark and the electrodes at once in the rigid printed wiring board. The first recognition mark can thus be positioned relative to the electrodes in the rigid printed wiring board with a high accuracy.

The flexible printed wiring board may comprise a wiring pattern layer defining the second recognition mark and electrodes respectively connected to the electrodes of the rigid printed wiring board. A single mask pattern can be utilized to form the second recognition mark and the electrodes at once in the flexible printed wiring board in the same manner as described above. The second recognition mark can thus be positioned relative to the electrodes in the flexible printed wiring board with a high accuracy. When the second recognition mark is positioned relative to the corresponding first recognition mark at the correct position, the electrodes of the flexible printed wiring board can reliably be connected to the corresponding electrodes of the rigid printed wiring board, respectively.

The geometric pattern may include a predetermined straight line continuous on the first and second recognition marks when the second member is superposed on the surface of the first member at the correct position. Alternatively, the geometric pattern may include a predetermined curved line continuous on the first and second recognition marks when the second member is superposed on the surface of the first member at the correct position. The edge of the second member may be defined based on an opening formed in the second member.

According to a second aspect of the present invention, there is provided a method of making a board module, comprising: superposing a second printed wiring board on a first printed wiring board; and coupling a second recognition mark to a first recognition mark so as to allow the second recognition mark to cooperate with the first recognition mark for establishment of a predetermined geometric pattern, the second recognition mark described on the surface of the second printed wiring board and ending at the edge of the second printed wiring board, the first recognition mark described on the surface of the first printed wiring board and fragmented along the edge of the second printed wiring board.

A part of the first recognition mark is exposed at a position outside the second printed wiring board. The second recognition mark is coupled to the exposed part of the first recognition mark. The relative position of the first and second recognition marks can be adjusted based on an irregular or unshaped geometric pattern. The second printed wiring board can thus reliably be superposed on the surface of the first printed wiring board at the correct position.

The method may further comprise: interposing an anisotropic electrically-conductive adhesive between a first wiring pattern and a second wiring pattern, the first wiring pattern formed on the first printed wiring board and defining the first recognition mark and first electrodes, the second wiring pattern formed on the second printed wiring board and defining the second recognition mark and second electrodes; and press-bonding the second printed wiring board to the first printed wiring board with the electrically-conductive adhesive interposed therebetween. In this manner, the second printed wiring board is superposed on the first printed wiring board after the second printed wiring board has correctly been positioned relative to the first printed wiring board.

The aforementioned method may be utilized to provide a specific electronic apparatus. The electronic apparatus may comprise: a first printed wiring board; a second printed wiring board superposed on the first printed wiring board; a first recognition mark described on the surface of the first printed wiring board, the first recognition mark fragmented along the edge of the second printed wiring board; and a second recognition mark described on the surface of the second printed wiring board, the second recognition mark ending at the edge of the second printed wiring board, the second recognition mark cooperating with the first recognition mark for establishment of a predetermined geometric pattern when the second printed wiring board is superposed on the surface of the first printed wiring board at a correct position, for example. The first and second printed wiring boards may have the structure identical to the structure of the aforementioned ones. The geometric pattern may have the structure identical to the structure of the aforementioned one.

The board module may be enclosed in the enclosure of a specific electronic apparatus, for example. In this case, the board module may comprise: a first printed wiring board; a second printed wiring board superposed on the first printed wiring board; a first recognition mark described on the surface of the first printed wiring board, the first recognition mark fragmented along the edge of the second printed wiring board; and a second recognition mark described on the surface of the second printed wiring board, the second recognition mark ending at the edge of the second printed wiring board, the second recognition mark cooperating with the first recognition mark for establishment of a predetermined geometric pattern when the second printed wiring board is superposed on the surface of the first printed wiring board at a correct position, for example.

A specific printed wiring board is provided to realize the aforementioned method of making a board module. The specific printed wiring board may comprise: a substrate; electrodes exposed on the surface of the substrate to respectively receive electrodes of a printed wiring board superposed on the substrate; and a recognition mark positioned relative to the electrodes on the surface of the substrate, the recognition mark fragmented along the edge of the printed wiring board superposed on the substrate. The substrate may be either a rigid substrate or a flexible substrate. Here, the rigid substrate and/or the flexible substrate may be opaque.

A specific printed wiring board is likewise provided to realize the method of making a board module. The specific printed wiring board may comprise: a substrate superposed on a receiving printed wiring board; electrodes exposed on the surface of the substrate and respectively superposed on electrodes exposed on the receiving printed wiring board; and a recognition mark positioned relative to the electrodes on the surface of the substrate, the recognition mark ending at the edge of the substrate. Here, the substrate may be a flexible substrate. The flexible substrate may have a transparency insufficient to visualize the surface of the receiving printed wiring board when the flexible substrate is superposed on the receiving printed wiring board.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
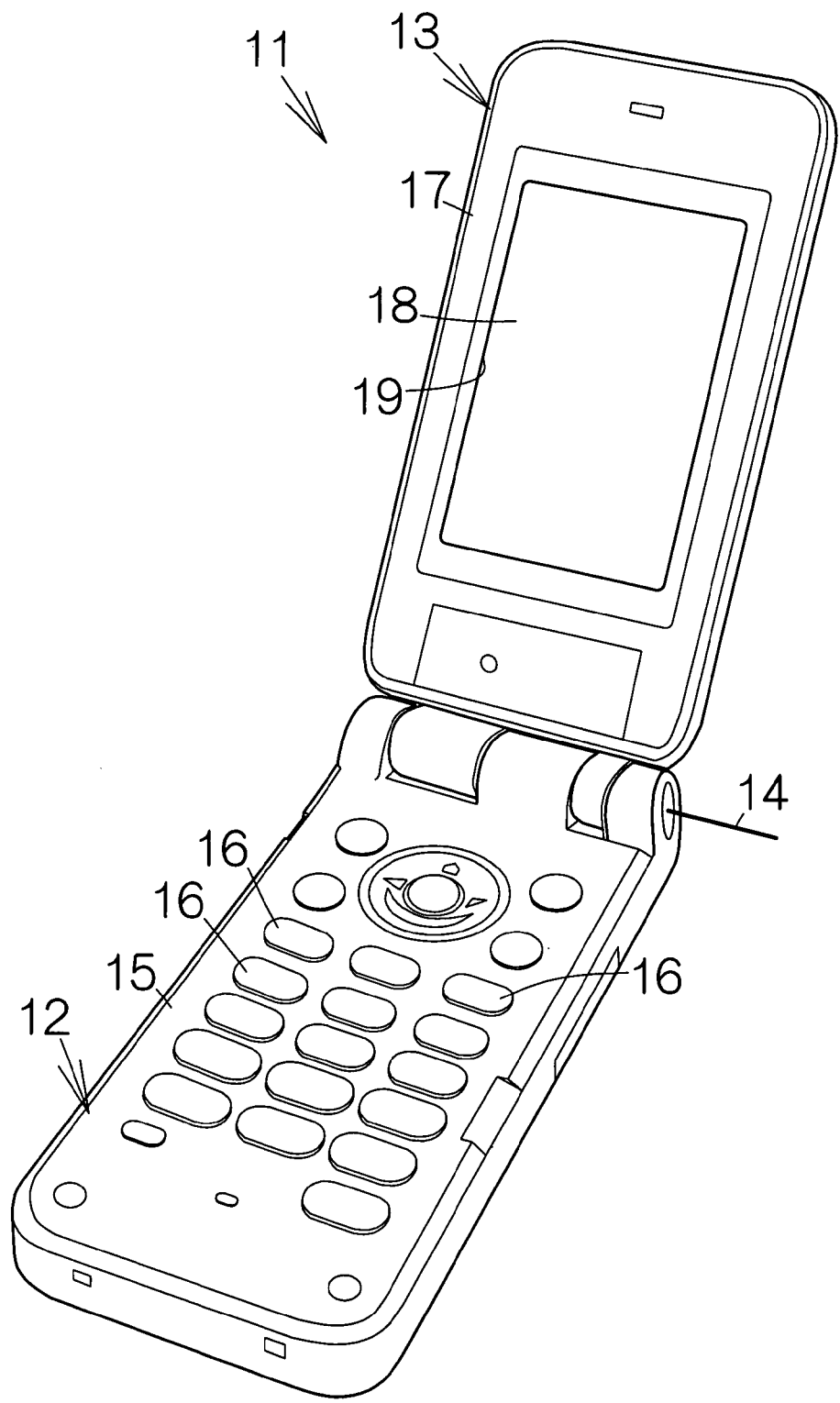
FIG. 1 is a perspective view illustrating a cellular phone terminal according to an embodiment of the present invention.

FIG. 1 schematically illustrates a cellular phone terminal 11 as an example of an electronic apparatus. The cellular phone terminal 11 has the structure of a so-called clamshell type. The cellular phone terminal 11 thus includes a main body 12 and a display body 13 hinged together. One end of the main body 12 is coupled to one end of the display body 13 for a relative rotation around a predetermined horizontal axis 14. The display body 13 is designed to swing relative to the main body 12 around the horizontal axis 14.

The main body 12 includes a main enclosure 15. A board module is incorporated in the main enclosure 15. The board module will be described later in detail. Processing circuits such as a central processing unit (CPU) and a memory are mounted on the board module.

A flat surface is defined in the main enclosure 15 in parallel with the horizontal axis 14. Operation buttons 16, such as an on-hook key, an off-hook key, ten keys, and the like, are embedded in the flat surface. The CPU executes various kinds of processing in response to manipulation of the operation buttons 16. The main enclosure 15 may be made of a reinforced resin material, for example.

The display body 13 includes a display enclosure 17. A flat surface is defined on the display enclosure 17 in parallel with the horizontal axis 14. A flat display panel unit, namely a liquid crystal display (LCD) panel unit 18, is embedded in the flat surface. An opening 19 is defined in the flat surface. A screen of the LCD panel unit 18 extends within the opening 19. Various texts and graphics are displayed on the screen of the LCD panel unit 18 in response to the processing of the CPU. The display enclosure 17 may be made of a reinforced resin material, for example.

The flat surface of the display body 13 and the horizontal axis 14 establish a positional relationship reflecting the positional relationship between the flat surface of the main body 12 and the horizontal axis 14. The flat surface of the display body 13 can thus be superposed on the flat surface of the main body 12 through the rotation of the display body 13 relative to the main body 12. The cellular phone terminal 11 is closed in this manner. This closed status serves to protect the operation buttons 16 and the LCD panel unit 18.

Figure 2:
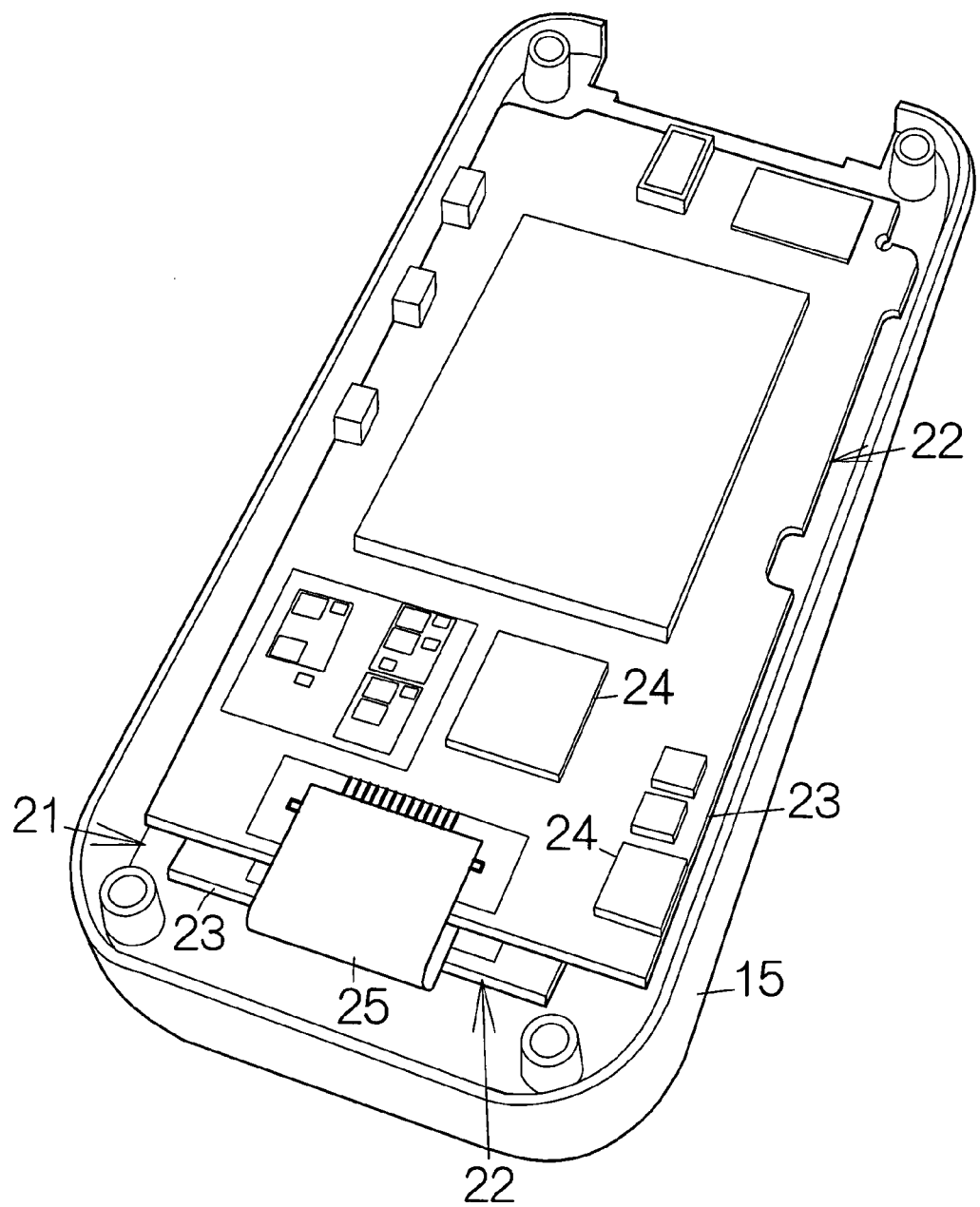
FIG. 2 is an enlarged perspective view schematically illustrating the inside of a main body.

As shown in FIG. 2, the board module 21 includes two pieces of printed circuit board units 22, 22. The individual printed circuit board unit 22 includes electronic components 24 mounted on a rigid printed wiring board 23. The electronic components 24 include the aforementioned CPU and memory. The rigid printed wiring boards 23 are placed in parallel with each other. The rigid printed wiring boards 23 are electrically connected to each other through a flexible printed wiring board 25. The flexible printed wiring board 25 is superposed on the rigid printed wiring boards 23, 23.

Figure 3:
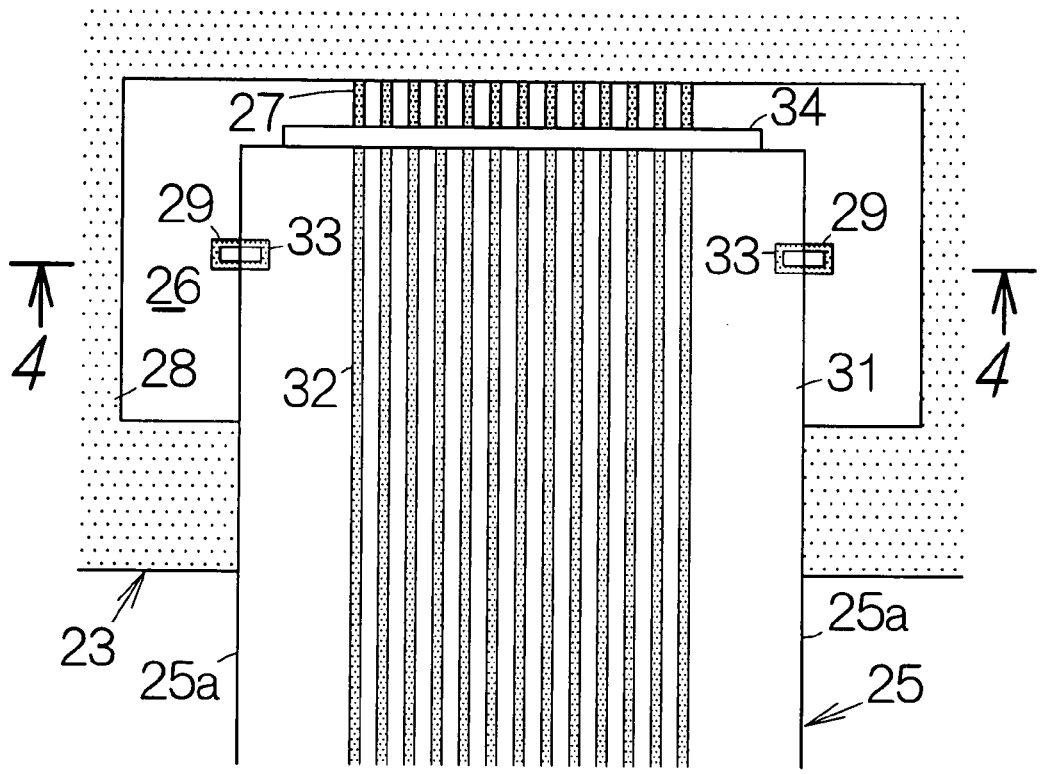
FIG. 3 is an enlarge plan view illustrating a rigid printed wiring board and a flexible printed wiring board coupled to each other.

As shown in FIG. 3, the individual rigid printed wiring board 23 includes a substrate 26. An opaque rigid substrate may be employed as the substrate 26. The substrate 26 may be made of an epoxy resin reinforced with glass fiber, for example. Lines of first electrodes 27 are formed on the front surface of the substrate 26. The first electrodes 27 are arranged at the pitch in a range from 0.1 mm to 0.5 mm, for example. The width of the individual first electrode 27 is set equal to the interval between the adjacent first electrodes 27. The first electrodes 27 are exposed on the front surface of the substrate 26. The first electrodes 27 are made of an electrically-conductive material such as copper, for example.

A wiring pattern, not shown, is formed on the front surface of the substrate 26. The wiring pattern is connected to the individual first electrode 27. The first electrodes 27 may be continuous with the wiring pattern. An insulating protection film 28 is formed on the front surface of the substrate 26, for example. The protection film 28 covers over the wiring pattern. The wiring pattern is made of an electrically-conductive material such as copper, for example. The protection film 28 may be made of an insulating resin material such as an epoxy resin, polyimide, or the like, for example.

First recognition marks 29, 29 are formed on the front surface of the substrate 26. The first recognition marks 29, 29 are respectively fragmented or divided along edges 25a, 25a of the flexible printed wiring board 25. Here, the edges 25a, 25a extend in parallel with each other and in parallel with the first electrodes 27. A part of the first recognition mark 29 is exposed on the front surface of the substrate 26. The remaining part of the recognition mark 29 is covered with the flexible printed wiring board 25.

The flexible printed wiring board 25 includes a substrate 31. A semitransparent flexible substrate may be employed as the substrate 31. The substrate 31 may be made of a resin material such as polyimide, polycarbonate (PC), polyethylene terephthalate (PET), polyethylene naphthalate (PEN), or the like, for example. Lines of second electrodes 32 are formed on the front surface of the substrate 31. The second electrodes 32 are located at positions corresponding to the first electrodes 27. Specifically, the individual second electrode 32 on the flexible printed wiring board 25 is connected to the corresponding one of the first electrodes 27 on the rigid printed wiring board 23.

Second recognition marks 33, 33 are described on the front surface of the substrate 31. The second recognition marks 33, 33 end at the edges 25a, 25a of the flexible printed wiring board 25 or substrate 31, respectively. The second recognition marks 33, 33 are thus coupled to the first recognition marks 29, 29, respectively. The first recognition marks 29 cooperate with the second recognition marks 33 for establishment of a continuous geometric pattern. Here, the first and second recognition marks 29, 33 in combination establish the outline of a rectangle.

The reversed flexible printed wiring board 25 is superposed on the front surface of the rigid printed wiring board 23. Specifically, the front surface of the flexible printed wiring board 25 faces the front surface of the rigid printed wiring board 23. The second electrodes 32 on the flexible printed wiring board 25 thus face the corresponding first electrodes 27 on the rigid printed wiring board 23, respectively. Since the substrate 31 of the flexible printed wiring board 25 is semitransparent, the second electrodes 32 and the second recognition marks 33 are visible at the upward back surface of the flexible printed wiring board 25. The second electrodes 32 and the second recognition marks 33 are thus visualized at the back surface of the flexible printed wiring board 25. On the other hand, the first electrodes 27 and the first recognition marks 29 on the rigid printed wiring board 23 become invisible at the back surface of the flexible printed wiring board 25. The first electrodes 27 and the first recognition marks 29 are partly hidden beneath the flexible printed wiring board 25.

Figure 4:
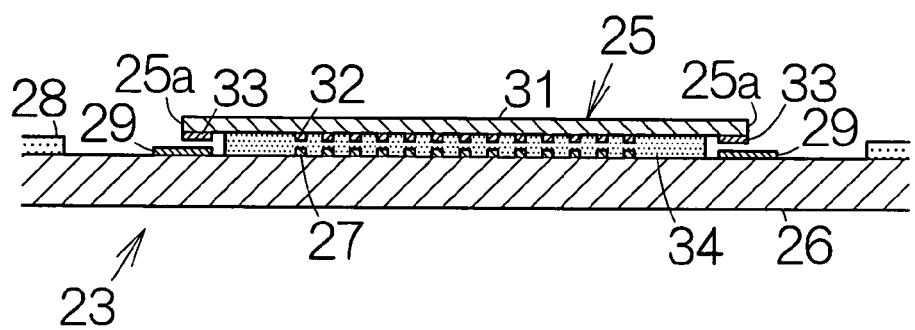
FIG. 4 is a sectional view taken along the line 4-4 in FIG. 3.

An anisotropic electrically-conductive adhesive 34 is interposed between the flexible printed wiring board 25 and the rigid printed wiring board 23. As is apparent from FIG. 4, the electrically-conductive adhesive 34 serves to bond the first electrodes 27 to the corresponding second electrodes 32. The electrically-conductive adhesive 34 is made of a thermosetting resin such as epoxy resin. Electrically-conductive particles are dispersed in the thermosetting resin. The electrically-conductive particles are held between the first and second electrodes 27, 32. This results in establishment of electric connection between the first and second electrodes 27, 32. The resin serves to insulate the individual electrode 27, 32 from the adjacent one or ones.

Figure 5:
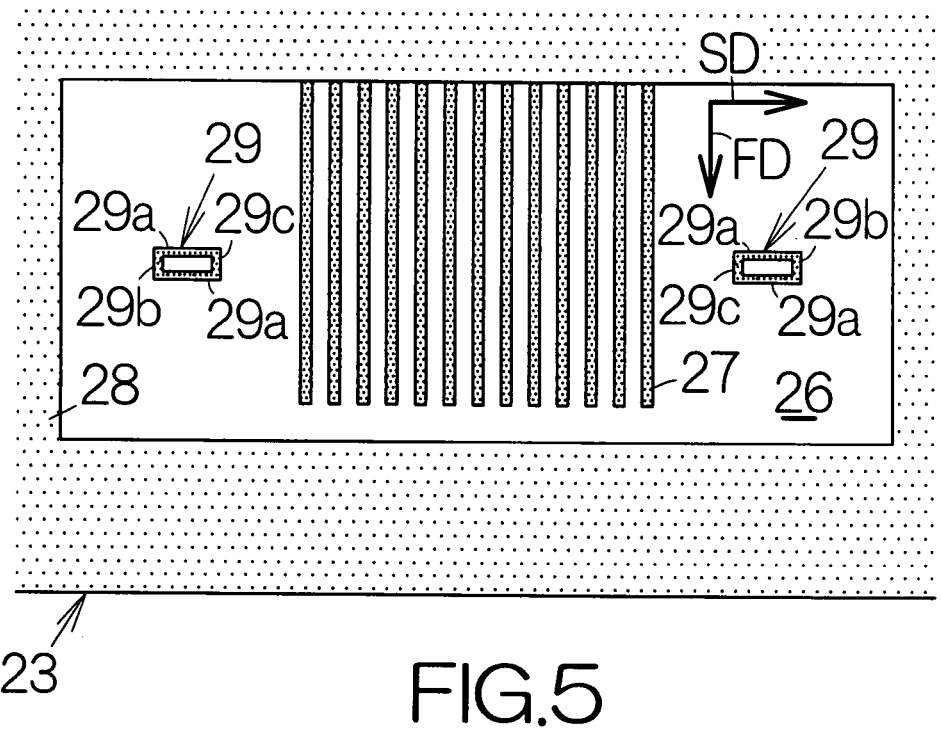
FIG. 5 is an enlarged plan view illustrating a part of the rigid printed wiring board.

Next, a brief description will be made on a method of making the board module 21. The rigid printed wiring board 23 and the flexible printed wiring board 25 are first prepared. As shown in FIG. 5, the lines of the first electrodes 27 and the first recognition marks 29 are formed on the front surface of the substrate 26 in the rigid printed wiring board 23. The first electrodes 27 and the first recognition marks 29 are formed in a single wiring pattern layer. Specifically, a single mask pattern is utilized to form the first electrodes 27 and the first recognition marks 29 at once. The first recognition marks 29 can thus be positioned relative to the array of the first electrodes 27 with a high accuracy.

The first electrodes 27 extend on straight lines in parallel with each other in a first direction FD. Each of the first recognition marks 29 establishes a complete geometric pattern. The geometric pattern includes a pair of first parallel lines 29a, 29a and a pair of second parallel lines 29b, 29c. The first parallel lines 29a, 29a extend in a second direction SD perpendicular to the first direction FD. The second parallel lines 29b, 29c extend in the first direction FD. The first and second parallel lines 29a, 29a, 29b, 29c in combination define the outline of a rectangle. One of the first recognition marks 29, 29 is spaced from the other of the first recognition marks 29, 29 in the second direction SD at a predetermined interval.

Figure 6:
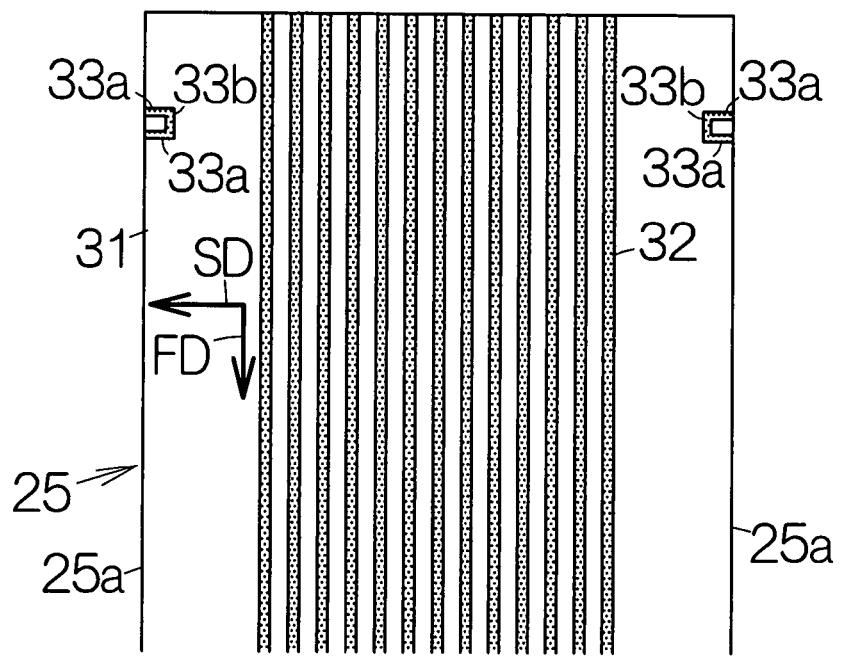
FIG. 6 is an enlarged plan view illustrating a part of the flexible printed wiring board.

As shown in FIG. 6, the lines of the second electrodes 32 and the second recognition marks 33 are formed on the front surface of the substrate 31 in the flexible printed wiring board 25. The second electrodes 32 and the second recognition marks 33 are formed in a single wiring pattern layer. Specifically, a single mask pattern is utilized to form the second electrodes 32 and the second recognition marks 33 at once. The second recognition marks 33 can thus be positioned relative to the array of the second electrodes 32 with a high accuracy.

The second electrodes 32 extend on straight lines in parallel with each other in the first direction FD. The interval between the adjacent ones of the second electrodes 32 is set equal to the interval between the adjacent ones of the first electrodes 27. Each of the second recognition marks 33 establishes apart of the aforementioned geometric pattern. The second recognition mark 33 includes a pair of parallel lines 33a, 33a and a segment 33b. The parallel lines 33a, 33a extend in the second direction SD perpendicular to the first direction FD. The segment 33b extends in the first direction FD. The parallel lines 33a, 33a and the segment 33b in combination establish a part of the outline of the rectangle. The parallel lines 33a, 33a of the second recognition mark 33 end at the edge 25a of the substrate 31 in the printed wiring board 25. The interval between the segments 33b is set equal to the interval between the second parallel lines 29c, 29c of the first recognition marks 29, 29 on the rigid printed wiring board 23. Moreover, a mirror-image relationship is established between the positional relationship of the second recognition marks 33 relative to the array of the second electrodes 32 and the positional relationship of the first recognition marks 29 relative to the array of the first electrodes 27. Specifically, when observed from the back side of the flexible printed wiring board 25, the positional relationship between the array of the second electrodes 32 and the second recognition marks 33 reflects the positional relationship between the array of the first electrodes 27 and the first recognition marks 29.

Figure 7:
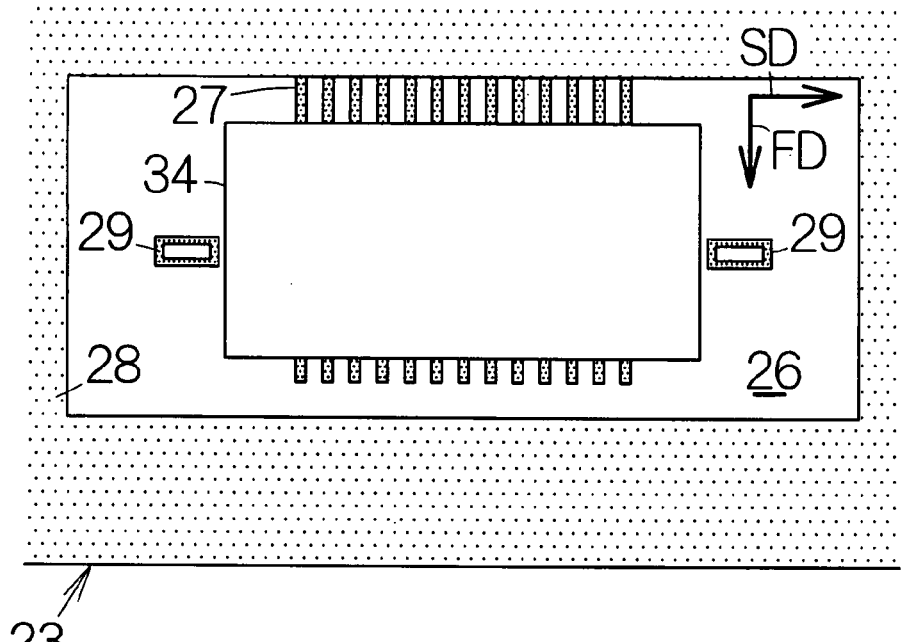
FIG. 7 is an enlarged plan view of the rigid printed wiring board supporting an electrically-conductive adhesive.

The rigid printed wiring board 23 and the flexible printed wiring board 25 are set on a press-bonding apparatus, for example. The rigid printed wiring board 23 is fixed on a horizontal plane of a support in the press-bonding apparatus, for example. As shown in FIG. 7, the electrically-conductive adhesive 34 shaped in a sheet, for example, is placed on the front surface of the rigid printed wiring board 23. The electrically-conductive adhesive 34 covers over each of the first electrodes 27. The first recognition marks 29, 29 are kept exposed at positions off the electrically-conductive adhesive 34.

Figure 8:
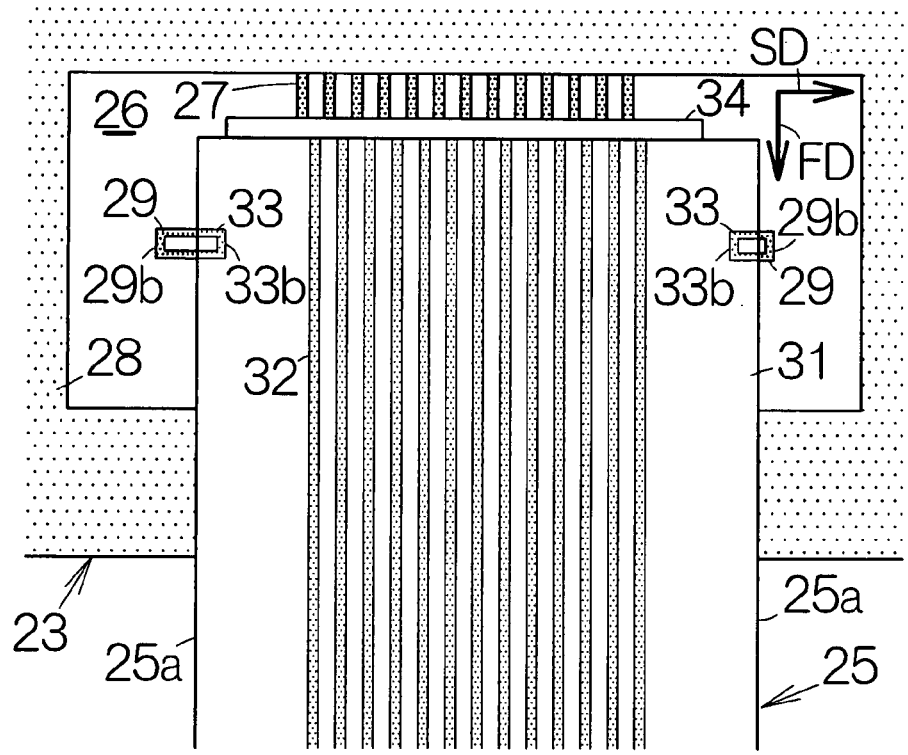
FIG. 8 is an enlarged plan view illustrating the flexible printed wiring board shifted in a second direction.

The flexible printed wiring board 25 is attached to a supporting mechanism. As shown in FIG. 8, the supporting mechanism allows the front surface of the flexible printed wiring board 25 to face the front surface of the rigid printed wiring board 23. The second electrodes 32 are allowed to face the electrically-conductive adhesive 34. The supporting mechanism enables a minute displacement of the flexible printed wiring board 25 in the horizontal direction along the front surface of the rigid printed wiring board 23.

As shown in FIG. 8, when the flexible printed wiring board 25 is shifted relative to the rigid printed wiring board 23 in the second direction SD, for example, intervals different from a predetermined interval are established between the segments 33b of the second recognition marks 33 and the corresponding second parallel lines 29b. The supporting mechanism serves to move the flexible printed wiring board 25 in the second direction SD so as to counteract the deviation between the intervals and the predetermined interval. The geometric patterns have the identical shape, so that the comparison of the size between the geometric patterns contributes to a facilitated elimination of a shift in the second direction SD.

Figure 9:
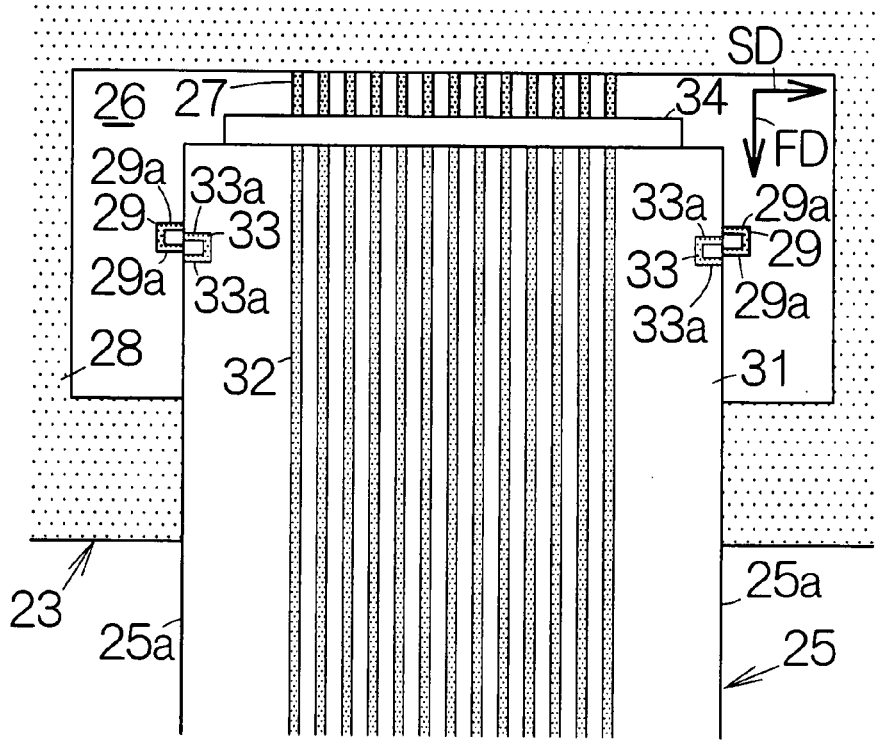
FIG. 9 is an enlarged plan view illustrating the flexible printed wiring board shifted in a first direction.

Likewise, as shown in FIG. 9, when the flexible printed wiring board 25 is shifted relative to the rigid printed wiring board 23 in the first direction FD, for example, continuity is broken between the parallel lines 33a of the second recognition mark 33 and the first parallel lines 29a of the corresponding first recognition mark 29. The supporting mechanism serves to move the flexible printed wiring board 25 in the first direction FD so as to counteract such shift in the first direction FD. Moreover, if the parallel lines 33a of the second recognition mark 33 are kept in parallel with the first parallel lines 29a of the corresponding first recognition mark 29, a relative rotation can be prevented between the flexible printed wiring board 25 and the rigid printed wiring board 23.

The flexible printed wiring board 25 inevitably suffers from a shape error of the edges 25a during the production. The edges 25a are not always positioned relative to the second electrodes 32 with a high accuracy. The second recognition mark 33 allows the segment 33b to align to the second electrodes 32 with a high accuracy. As long as the segment 33b of the second recognition mark 33 is correctly positioned relative to the second parallel line 29b of the corresponding first recognition mark 29 regardless of any shape error of the corresponding edge 25a, the individual second electrode 32 can thus accurately be positioned relative to the corresponding first electrode 27 in the second direction SD. Moreover, the parallel lines 33a and the first parallel lines 29a are established based on the segment 33b and the second parallel lines 29b thus positioned with a high accuracy in the aforementioned manner. As long as the parallel lines 33a of the second recognition marks 33 are correctly positioned relative to the corresponding first parallel lines 29a of the first recognition marks 29 regardless of any shape error of the edges 25a, the individual second electrode 32 can thus accurately be positioned relative to the corresponding first electrode 27 in the first direction FD.

The second recognition marks 33 are thus joined with the corresponding first recognition marks 29, respectively. The first parallel lines 29a of the individual first recognition mark 29 cooperate with the parallel lines 33a of the corresponding second recognition mark 33 for establishment of continuous parallel straight lines. When the second recognition mark 33 and the corresponding first recognition mark 29 establish the complete geometric pattern, the individual second electrode 32 is allowed to face the corresponding first electrode 27 with a high positional accuracy. After the second electrodes 32 have correctly been positioned relative to the corresponding first electrodes 27, a press-bonding head is urged against the flexible printed wiring board 25 on the electrically-conductive adhesive 34. The applied pressure serves to force the electrically-conductive particles contained in the electrically-conductive adhesive 34 to contact with both the individual first electrode 27 and the corresponding second electrode 32. The applied heat serves to force the thermosetting resin in the electrically-conductive adhesive 34 to get cured or hardened. The flexible printed wiring board 25 is in this manner bonded to the rigid printed wiring board 23. It should be noted that either a manual operation by an operator or an automatic operation may be employed to cause the flexible printed wiring board 25 to move in the press-bonding apparatus. In the manual operation by the operator, the operator may check with eyes the first and second recognition marks 29, 33 for coupling the first and second recognition marks 29, 33 to each other. In the automatic operation, an image-recognition device may be utilized to couple the first and second recognition marks 29, 33 to each other.

Figure 10:
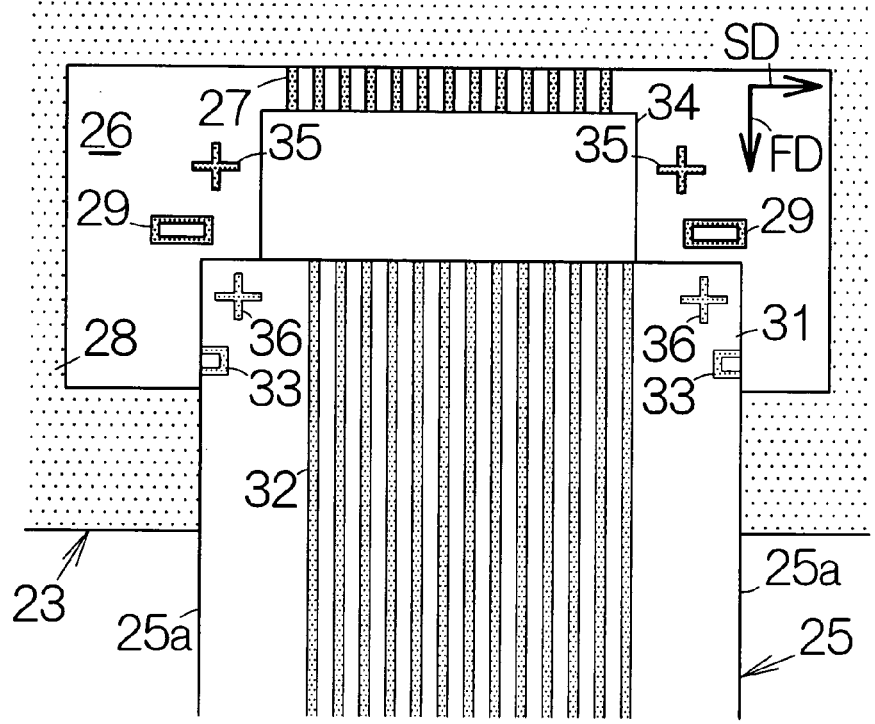
FIG. 10 is an enlarged plan view schematically illustrating a rigid printed wiring board and a flexible printed wiring board according to another embodiment of the present invention.

As shown in FIG. 10, for example, the board module 21 may further include third recognition marks 35 and fourth recognition marks 36. The third and fourth recognition marks 35, 36 may be described in an identical shape. Alternatively, the third and fourth recognition marks 35, 36 may take any shapes different from each other as long as the shapes are useful for positioning. Here, the third and fourth recognition marks 35, 36 are formed in the shape of across. The individual fourth recognition mark 36 is positioned relative to the corresponding third recognition mark 35. An image processing apparatus is utilized for the positioning, for example. The image processing apparatus includes a camera having a half mirror. The image processing apparatus causes the camera to go into a space between the flexible printed wiring board 25 and the rigid printed wiring board 23, for example. The third and fourth recognition marks 35, 36 are thus projected on a single rectangular coordinates. The positioning is achieved through the automatic operation in this manner. In case the image processing apparatus fails to recognize the image, the operator may work on the second recognition marks 33 for alignment with the first recognition marks 29. This results in improvement of the yield as compared with utilization of only the automatic operation.

Figure 11:
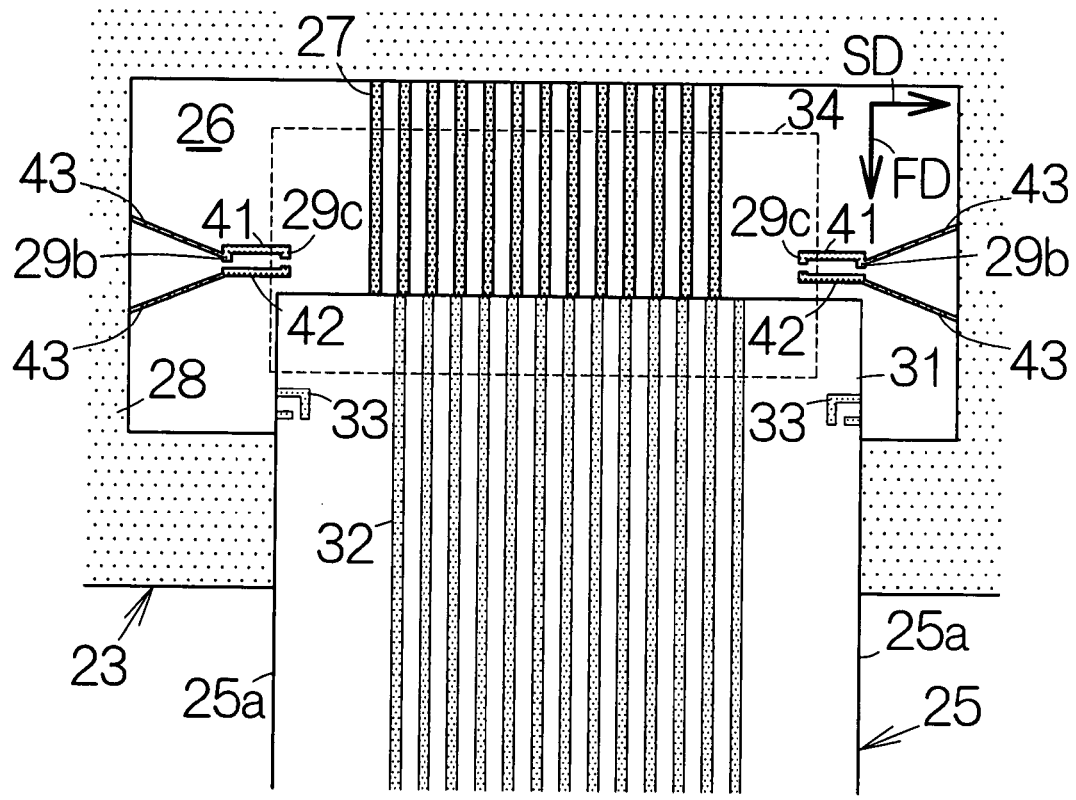
FIG. 11 is an enlarged plan view schematically illustrating a rigid printed wiring board and a flexible printed wiring board according to still another embodiment of the present invention.

As shown in FIG. 11, for example, each of the second parallel lines 29b, 29c may be fragmented in the individual first recognition mark 29. The fragmentation allows establishment of a first piece 41 and a second piece 42 in the first recognition mark 29. The second piece 42 is spaced from the first piece 41 at a predetermined interval. The first piece 41 is designed to cross the edge 25a of the flexible printed circuit board 25 when the flexible printed wiring board 25 is superposed on the front surface of the rigid printed wiring board 23 at the correct position. The second piece 42 is likewise designed to cross the edge 25a of the flexible printed wiring board 25. Lead wiring patterns 43, 43 are respectively connected to the first and second pieces 41, 42.

Figure 12:
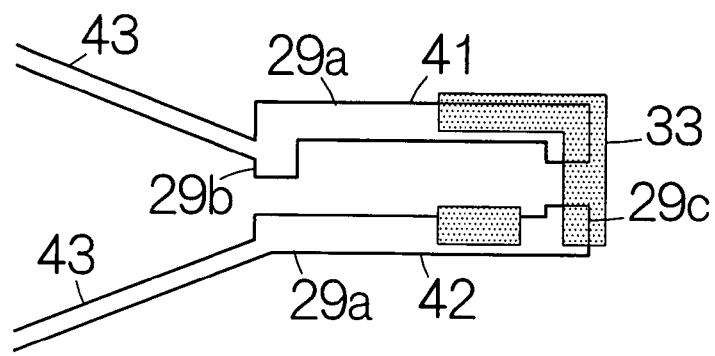
FIG. 12 is an enlarged plan view schematically illustrating the first and second recognition marks.

The electrically-conductive adhesive 34 covers over at least the second parallel line 29c of the first recognition mark 29. As shown in FIG. 12, when the second recognition mark 33 is overlaid on the first recognition mark 29, the second recognition mark 33 serves to establish electric connection between the first and second pieces 41, 42. Electric current is thus taken out through the lead wiring patterns 43, 43. When the second recognition mark 33 is remarkably shifted from the first recognition mark 29, the second recognition mark 33 gets distanced away from the second parallel line 29c of the first recognition mark 29. The electric connection is thus broken. The electric current can in this manner be employed as a sign for alignment between the rigid printed wiring 23 and the flexible printed wiring board 25.

Figure 13:
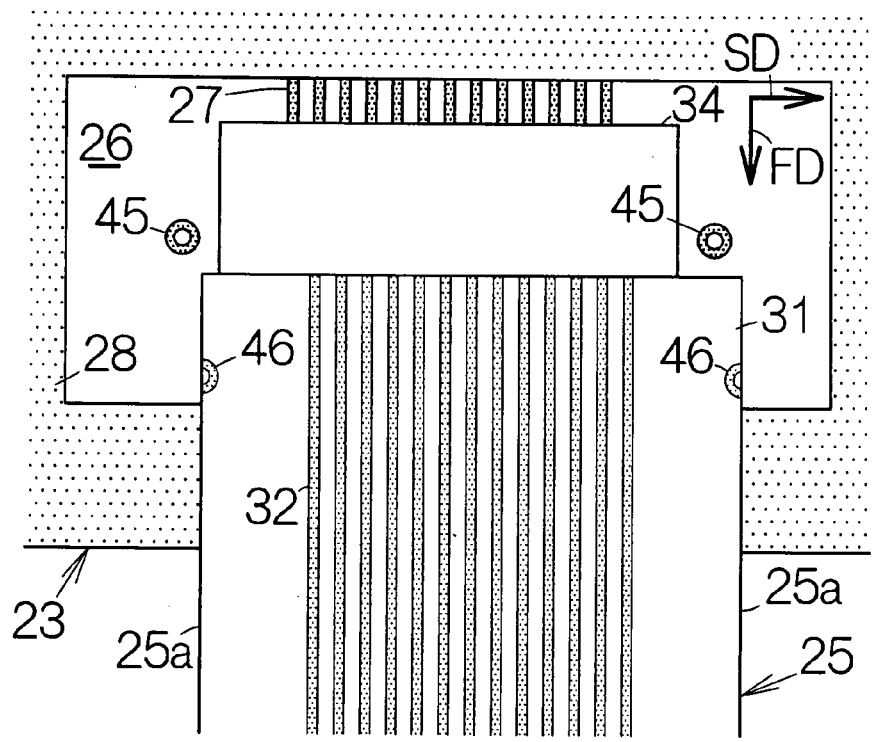
FIG. 13 is an enlarged plan view schematically illustrating a rigid printed wiring board and a flexible printed wiring board according to yet still another embodiment of the present invention.

As shown in FIG. 13, for example, first and second recognition marks 45, 46 may be utilized in the board module 21 in place of the aforementioned first and second recognition marks 29, 33. The individual first recognition mark 45 cooperates with the corresponding second recognition mark 46 for establishment of a predetermined curved line. Here, the first and second recognition marks 45, 46 in combination establish the outline of a circle. The first recognition mark 45 forms the outline of a full circle. A single mask pattern may be utilized to form the first recognition marks 45 and the first electrodes 27 at once in the same manner as described above. The second recognition mark 46 forms the outline of a part of a circle positioned relative to the array of the second electrodes 32. A single mask pattern may also be utilized to form the second recognition marks 46 and the second electrodes 32 at once. The outline of a part of a circle of the second recognition mark 46 ends at the corresponding edge 25a of the flexible printed wiring board 25 or the substrate 31. When observed from the back side of the flexible printed wiring board 25, the positional relationship between the array of the second electrodes 32 and the second recognition marks 46 reflects the positional relationship between the array of the first electrodes 27 and the first recognition marks 45. Like reference numerals are attached to the structure or components equivalent to those of the aforementioned embodiment. The first and second recognition marks 45, 46 are allowed to achieve advantages similar to those of the aforementioned first and second recognition marks 29, 33.

Figure 14:
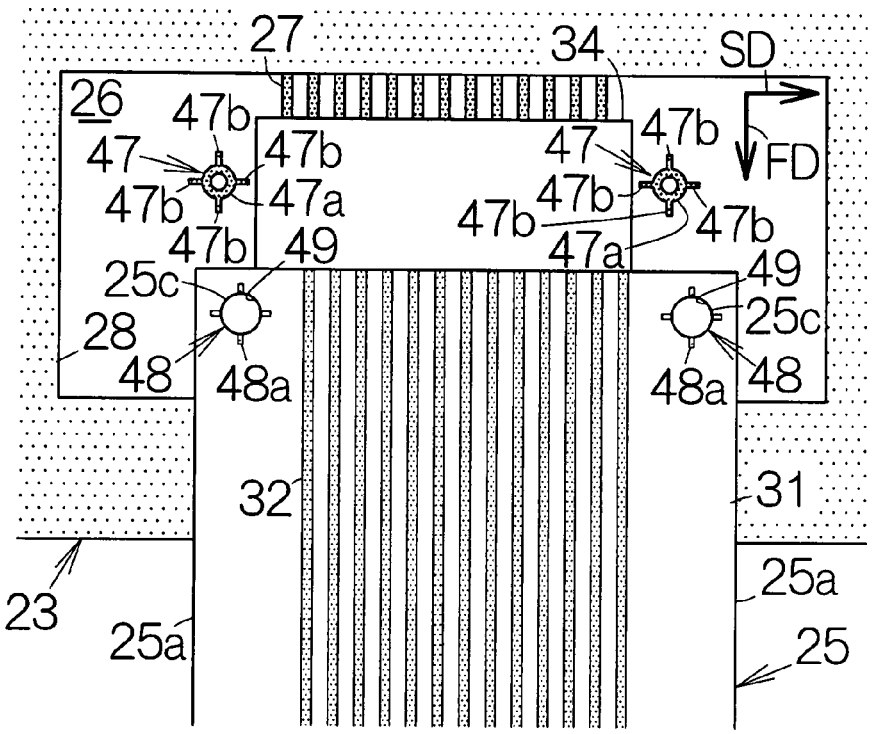
FIG. 14 is an enlarged plan view schematically illustrating a rigid printed wiring board and a flexible printed wiring board according to still another embodiment of the present invention.

As shown in FIG. 14, for example, first and second recognition marks 47, 48 may be utilized in the board module 21 in place of the first and second recognition marks 29, 33. The individual first recognition mark 47 includes a circular outline 47a and four segments 47b radially extending from the circular outline 47a in the first and second directions FD, SD perpendicular to each other. A single mask pattern is utilized to form the first electrodes 27 and the first recognition marks 47 at once in the same manner as described above. The centers of the circular outlines 47a are spaced from each other in the second direction SD at a predetermined interval.

Circular openings 49 are formed in the flexible printed wiring board 25. The openings 49 are defined along edges 25c of the flexible printed wiring board 25, respectively. The distance between the centers of the openings 49 is set equal to the distance between the centers of the circular outlines 47a. Moreover, when observed from the back side of the flexible printed wiring board 25, the positional relationship between the array of the second electrodes 32 and the centers of the openings 49 reflects the positional relationship between the array of the first electrodes 27 and the centers of the circular outlines 47a.

Figure 15:
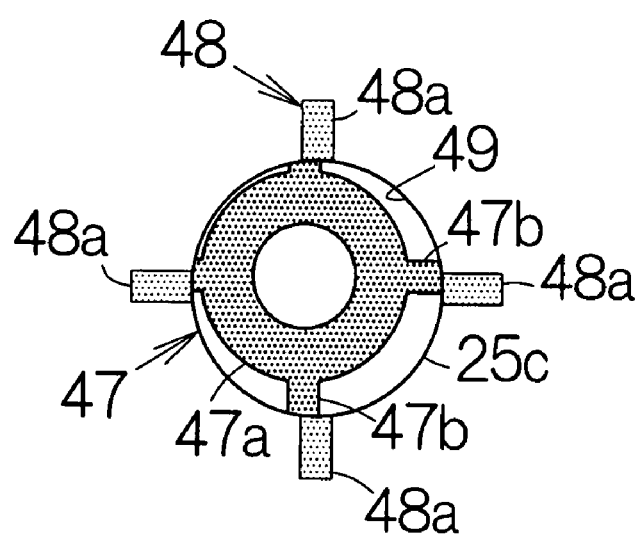
FIG. 15 is an enlarged plan view schematically illustrating the first and second recognition marks.

The individual second recognition mark 48 includes four segments 48a radially extending from the edge 25c in the first and second directions FD, SD. The segments 48a end at the edge 25c. As is apparent from FIG. 15, when the flexible printed wiring board 25 is superposed on the rigid printed wiring board 23 at the correct position, the centers of the openings 49 stay right on the centers of the circular outlines 47a, respectively. Simultaneously, the segments 48a of the second recognition marks 48 are coupled to the segments 47b of the first recognition marks 47, respectively. The first and second recognition marks 47, 48 in combination establish four continuous straight lines. Like reference numerals are attached to the structure or components equivalent to those of the aforementioned embodiments. The first and second recognition marks 47, 48 are allowed to achieve advantages similar to those of the aforementioned first and second recognition marks 29, 33.

It should be noted that the flexible printed wiring board 25 and/or the rigid printed wiring board 23 may be transparent in the aforementioned board module 21. The first and second recognition marks 29, 33, 45, 46, 47, 48 can be utilized not only to position the rigid printed wiring board 23 and the flexible printed wiring board 25 relative to each other but also to position a first member relative to a second members to be superposed on the first member.

What is claimed is:

1. An assembly module comprising:
   a first member;
   a second member superposed on the first member;
   a first recognition mark described on a surface of the first member, the first recognition mark fragmented along an edge of the second member; and
   a second recognition mark described on a first surface of the second member, the second recognition mark providing a projection at a second surface of the second member, the projection being visible at the second surface to cooperate with the first recognition mark for establishment of a predetermined geometric pattern when the first surface of the second member is superposed on the surface of the first member at a correct position;
   wherein the second member has a transparency insufficient to visualize the first recognition mark when the second member is superposed on the first member to at least partly cover the first recognition mark.

2. The assembly module according to claim 1, wherein the first member is opaque.

3. The assembly module according to claim 1, wherein the geometric pattern includes a predetermined straight line continuous on the first recognition mark and the projection when the first surface of the second member is superposed on the surface of the first member at the correct position.

4. The assembly module according to claim 1, wherein the geometric pattern includes a predetermined curved line continuous on the first recognition mark and the projection when the first surface of the second member is superposed on the surface of the first member at the correct position.

5. The assembly module according to claim 1, wherein the edge is defined based on an opening formed in the second member.

6. An assembly module comprising:
   a rigid printed wiring board;
   a flexible printed circuit board superposed on the rigid printed wiring board;
   a first recognition mark described on a surface of the rigid printed wiring board, the first recognition mark fragmented along an edge of the flexible printed wiring board; and
   a second recognition mark described on a first surface of the flexible printed wiring board, the second recognition mark providing a projection at a second surface of the flexible printed wiring board, the projection being visible at the second surface to cooperate with the first recognition mark for establishment of a predetermined geometric pattern when the first surface of the flexible printed wiring board is superposed on the surface of the rigid printed wiring board at a correction position;
   wherein the rigid printed wiring board is opaque.

7. The assembly module according to claim 6, wherein the flexible printed wiring board has a transparency insufficient to visualize the first recognition mark when the flexible printed wiring board is superposed on the rigid printed wiring board to at least partly cover the first recognition mark.

8. The assembly module according to claim 7, wherein the rigid printed wiring board includes a wiring pattern layer defining the first recognition mark and electrodes.

9. The assembly module according to claim 8, wherein the first recognition mark is positioned relative to the electrodes in the wiring pattern layer.

10. The assembly module according to claim 9, wherein the flexible printed wiring board comprises a wiring pattern layer defining the second recognition mark and electrodes respectively connected to the electrodes of the rigid printed wiring board.

11. The assembly module according to claim 10, wherein the second recognition mark is positioned relative to the electrodes of the flexible printed wiring board in the wiring pattern layer of the flexible printed wiring board.

12. An electronic apparatus comprising:
    a first printed wiring board;
    a second printed wiring board superposed on the first printed wiring board;
    a first recognition mark described on a surface of the first printed wiring board, the first recognition mark fragmented along an edge of the second printed wiring board; and
    a second recognition mark described on a first surface of the second printed wiring board, the second recognition mark providing a projection at a second surface of the second printed wiring board, the projection being visible at the second surface to cooperate with the first recognition mark for establishment of a predetermined geometric pattern when the first surface of the second printed wiring board is superposed on the surface of the first printed wiring board at a correct position,
    wherein the second printed wiring board has a transparency insufficient to visualize the first recognition mark when the second printed wiring board is superposed on the first printed wiring board to at least partly cover the first recognition mark.

13. The electronic apparatus according to claim 12, wherein the first printed wiring board is a rigid printed wiring board.

14. The electronic apparatus according to claim 13, wherein the rigid printed wiring board is opaque.

15. The electronic apparatus according to claim 14, wherein the second printed wiring board is a flexible printed wiring board.

16. The electronic apparatus according to claim 12, wherein the rigid printed wiring board includes a wiring pattern layer defining the first recognition mark and electrodes.

17. The electronic apparatus according to claim 16, wherein the first recognition mark is positioned relative to the electrodes in the wiring pattern layer.

18. The electronic apparatus according to claim 17, wherein the flexible printed wiring board comprises a wiring pattern layer defining the second recognition mark and electrodes respectively connected to the electrodes of the rigid printed wiring board.

19. The electronic apparatus according to claim 18, wherein the second recognition mark is positioned relative to the electrodes of the flexible printed wiring board in the wiring pattern layer of the flexible printed wiring board.

20. The electronic apparatus according to claim 12, wherein the geometric pattern includes a predetermined straight line continuous on the first recognition mark and the projection when the first surface of the second printed wiring board is superposed on the surface of the first printed wiring board at the correct position.

21. The electronic apparatus according to claim 12, wherein the geometric pattern includes a predetermined curved line continuous on the first recognition mark and the projection when the first surface of the second printed wiring board is superposed on the surface of the first printed wiring board at the correct position.

22. The electronic apparatus according to claim 12, wherein the edge is defined based on an opening formed in the second printed wiring board.

* * * * *